(12) United States Patent
Lee

(10) Patent No.: US 9,559,329 B2
(45) Date of Patent: Jan. 31, 2017

(54) METHOD FOR FABRICATING DISPLAY DEVICE INCLUDING UNEVEN ELECTRODE AND DISPLAY DEVICE THEREOF

(71) Applicant: Samsung Display Co., Ltd., Yongin (KR)

(72) Inventor: Hyunshik Lee, Incheon (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 14/751,906

(22) Filed: Jun. 26, 2015

(65) Prior Publication Data

US 2016/0155787 A1 Jun. 2, 2016

(30) Foreign Application Priority Data

Dec. 2, 2014 (KR) .................. 10-2014-0170669

(51) Int. Cl.
 *H01J 63/04* (2006.01)
 *H01L 51/52* (2006.01)
 *H01L 27/32* (2006.01)

(52) U.S. Cl.
 CPC .......... *H01L 51/5225* (2013.01); *H01L 27/32* (2013.01); *H01L 27/3202* (2013.01); *H01L 27/3204* (2013.01); *H01L 27/3225* (2013.01); *H01L 27/3241* (2013.01); *H01L 27/3246* (2013.01); *H01L 27/3248* (2013.01); *H01L 27/3251* (2013.01); *H01L 27/3258* (2013.01); *H01L 51/5209* (2013.01); *H01L 51/5262* (2013.01); *H01L 51/5293* (2013.01); *H01L 27/3244* (2013.01); *H01L 2227/323* (2013.01)

(58) Field of Classification Search
 None
 See application file for complete search history.

(56) References Cited

U.S. PATENT DOCUMENTS

| 8,547,015 B2 | 10/2013 | Wolk et al. |
| 2002/0104995 A1* | 8/2002 | Yamazaki ........... H01L 27/3265 257/72 |
| 2012/0292649 A1 | 11/2012 | Sugiyama et al. |
| 2013/0084495 A1 | 4/2013 | Tajima et al. |
| 2015/0270327 A1* | 9/2015 | Oh ..................... H01L 51/5209 257/40 |

FOREIGN PATENT DOCUMENTS

| JP | 2008-235605 | 10/2008 |
| JP | 2009-292703 | 12/2009 |
| JP | 2014-022550 | 2/2014 |

* cited by examiner

*Primary Examiner* — Minh-Loan Tran
(74) *Attorney, Agent, or Firm* — H.C. Park & Associates, PLC

(57) ABSTRACT

A display device having an uneven electrode enhances display quality by improving the emission efficiency of the vertically polarized light. The method for fabricating a display device includes forming a thin film transistor on a base substrate, forming a first electrode connected to the thin film transistor, forming a block copolymer layer on the first electrode, patterning the block copolymer layer and forming a uneven first electrode having a plurality of electrode grooves by etching the first electrode exposed by the block copolymer pattern, and forming a light emitting layer on the uneven first electrode.

7 Claims, 10 Drawing Sheets

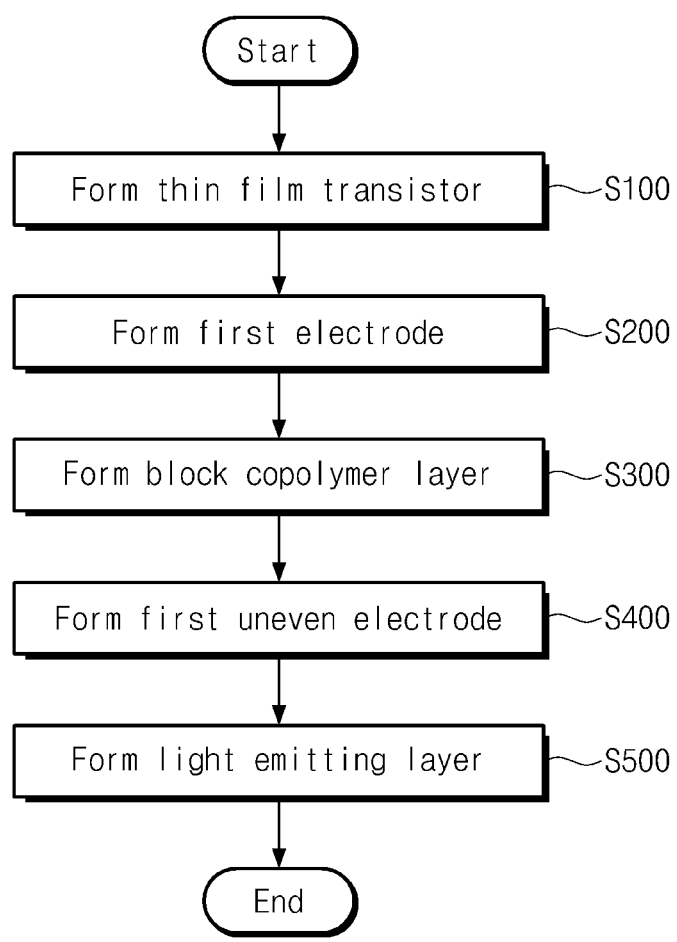

FIG. 6G
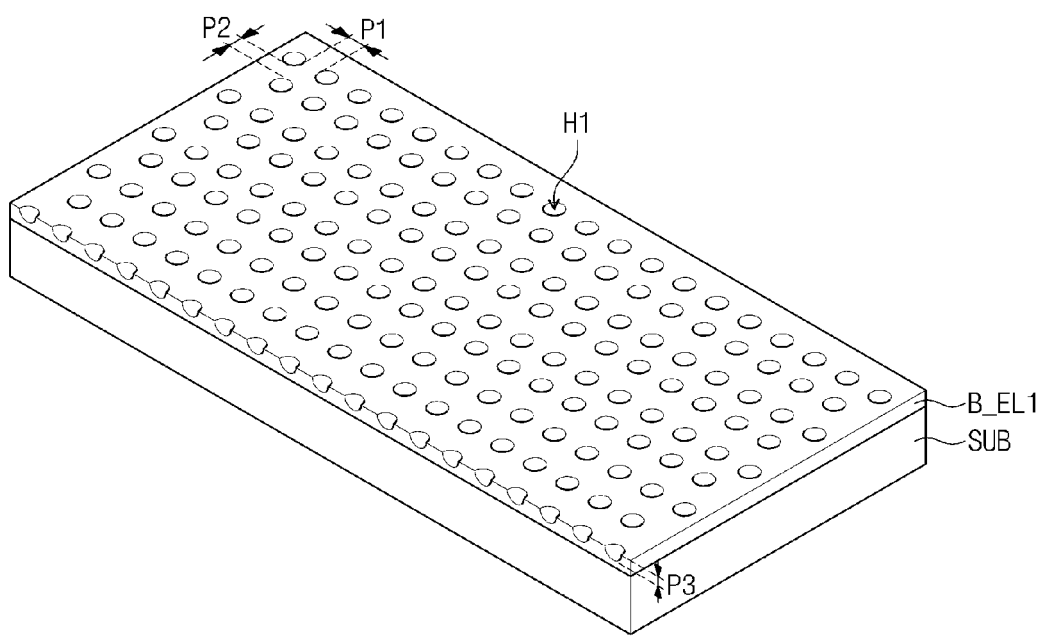
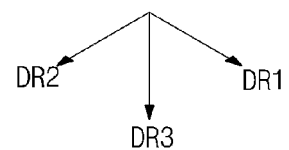

METHOD FOR FABRICATING DISPLAY DEVICE INCLUDING UNEVEN ELECTRODE AND DISPLAY DEVICE THEREOF

CROSS-REFERENCE TO RELATED APPLICATION

This U.S. non-provisional patent application claims priority from and the benefit of Korean Patent Application No. 10-2014-0170669, filed on Dec. 2, 2014, which is hereby incorporated by reference for all purposes as if fully set forth herein.

BACKGROUND

Field

Exemplary embodiments relate to a method for fabricating a display device, which is capable of improving display quality, and a display device fabricated by the same.

Discussion of the Background

An organic light emitting display (OLED) is an emissive display device and has a wide viewing angle, excellent contrast, and fast response speed.

Accordingly, since the OLED is applied to mobile devices such as a digital camera, a video camera, a portable information terminal, a smart phone, an ultra slim notebook computer, a tablet personal computer, and a flexible display device or large scale electrical/electronic products such as an ultra thin television, it receives great attentions.

The OLED may realize colors by using a principle in which holes and electrons, which are injected into first and second electrodes, are recombined with each other to emit light. That is, when excitons in which the injected holes and electrons are combined with each other return from an excited state to a ground state, light may be emitted.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a method for fabricating a display device, which provides a display device that is capable of improving display quality.

Exemplary embodiments provide a display device that is capable of improving display quality.

Additional aspects will be set forth in the detailed description which follows, and, in part, will be apparent from the disclosure, or may be learned by practice of the inventive concept.

According to exemplary embodiments, methods for fabricating a display device include: forming a thin film transistor on a base substrate; forming a first electrode connected to the thin film transistor; forming a block copolymer layer on the first electrode; patterning the block copolymer layer and forming a uneven first electrode having a plurality of electrode grooves by etching the first electrode exposed by the block copolymer pattern; and forming a light emitting layer on the uneven first electrode.

The electrode grooves are formed to be spaced a predetermined interval from each other.

The electrode grooves have a uniform depth.

The electrode grooves are formed in a top surface of the uneven first electrode.

Step of forming the uneven first electrode may include: patterning the block copolymer layer to form a block copolymer pattern; and etching the first electrode by using the block copolymer pattern as a mask to form the uneven first electrode having the electrode grooves.

Step of forming the block copolymer pattern may be performed by providing ozone, oxygen plasma, and UV.

Step of forming the block copolymer layer may be performed by using a block copolymer including first repeating units and second repeating units different from the first repeating units.

Step of forming the block copolymer pattern may include: rearranging the first repeating units and the second repeating units to form a self-assembly structure in which the first repeating units and the second repeating units are alternately arranged; and removing the first repeating units to form the block copolymer pattern.

Step of forming the self-assembly structure may be performed through thermal processing or solvent annealing.

Step of forming the self-assembly structure, the block copolymer may be self-assembled with a sphere, cylinder, lamellar, gyroid, or hexagonal perforated cylinder (HPL) structure.

Step of forming the uneven first electrode may include: etching the first electrode by using the second repeating units as a mask; and removing the second repeating units.

Step of removing the second repeating units may include removing the second repeating units disposed on the base substrate and the uneven first electrode.

The methods may further include forming a second electrode on the light emitting layer.

In other embodiments of the inventive concept, display devices include: a base substrate; and a plurality of pixels, wherein at least one of the pixels includes: a thin film transistor disposed on the base substrate; an uneven first electrode connected to the thin film transistor, the uneven first electrode having a plurality of electrode grooves; a light emitting layer disposed on the uneven first electrode; and a second electrode disposed on the light emitting layer.

The electrode grooves may be defined to be spaced a first interval from each other in the first direction, and defined to be spaced a second interval from each other in the second direction crossing the first direction.

Each of the first interval and the second interval is about 150 nm to about 350 nm.

The electrode grooves may have a uniform depth, and the depth of the electrode grooves is about 5 nm to about 1,000 nm The electrode grooves may be defined in a top surface of the uneven first electrode.

Each of the light emitting layer and the second electrode may include a plurality of grooves corresponding to the electrode grooves.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

FIG. 5 is a schematic flowchart illustrating a method for fabricating the display device according to an embodiment of the inventive concept.

FIG. 6G is a schematic perspective view of the display device of FIG. 6F.

DETAILED DESCRIPTION OF THE ILLUSTRATED EMBODIMENTS

Figure 1:
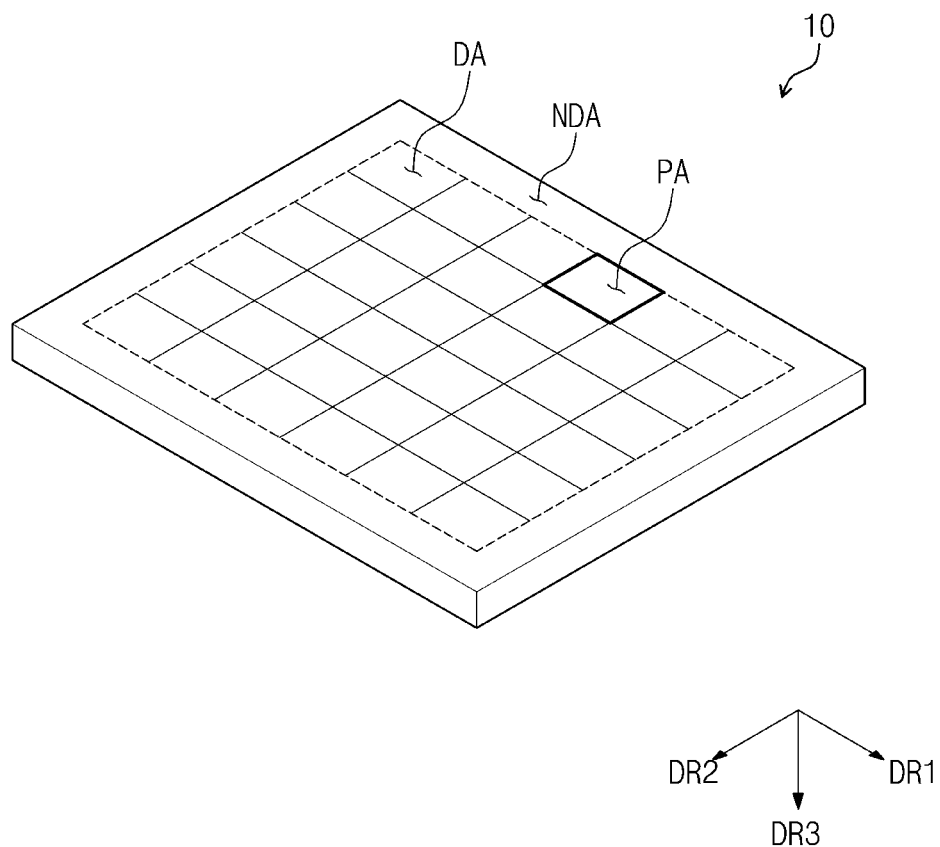
FIG. 1 is a schematic perspective view of a display device according to an embodiment of the inventive concept.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is a schematic perspective view of a display device according to an embodiment of the inventive concept.

Referring to FIG. 1, the display device 10 includes a display area DA and a non-display area NDA.

An image is displayed on the display area DA. When viewed in a thickness direction (for example, a DR3 direction in FIG. 1) of the display device 10, the display area DA may have an approximately rectangular shape, but is not limited thereto.

The display area DA includes a plurality of pixel areas PA. The plurality of pixel areas PA may be arrayed in a matrix form. The plurality of pixel areas PA may be defined by a pixel defining layer (see reference symbol PDL of FIG. 4).

A plurality of pixels (see reference symbol PX of FIG. 2) may be disposed on the plurality of pixel areas PA, respectively.

An image is not displayed on the non-display area NDA. For example, the non-display area may surround the display area DA.

Figure 2:
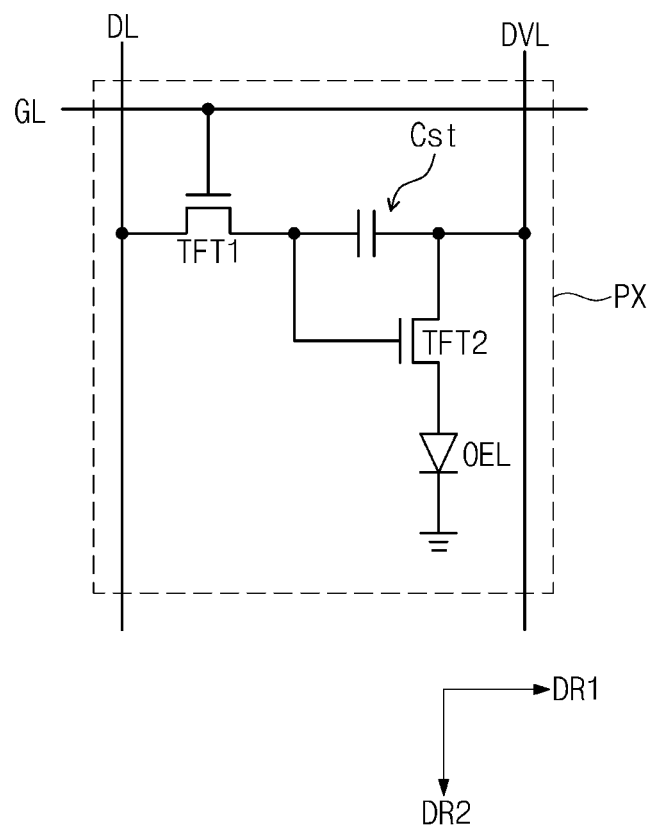
FIG. 2 is a circuit view of one of pixels provided in the display device according to an embodiment of the inventive concept.

FIG. 2 is a circuit view of one of the pixels provided in the display device according to an embodiment of the inventive concept.

Figure 3:
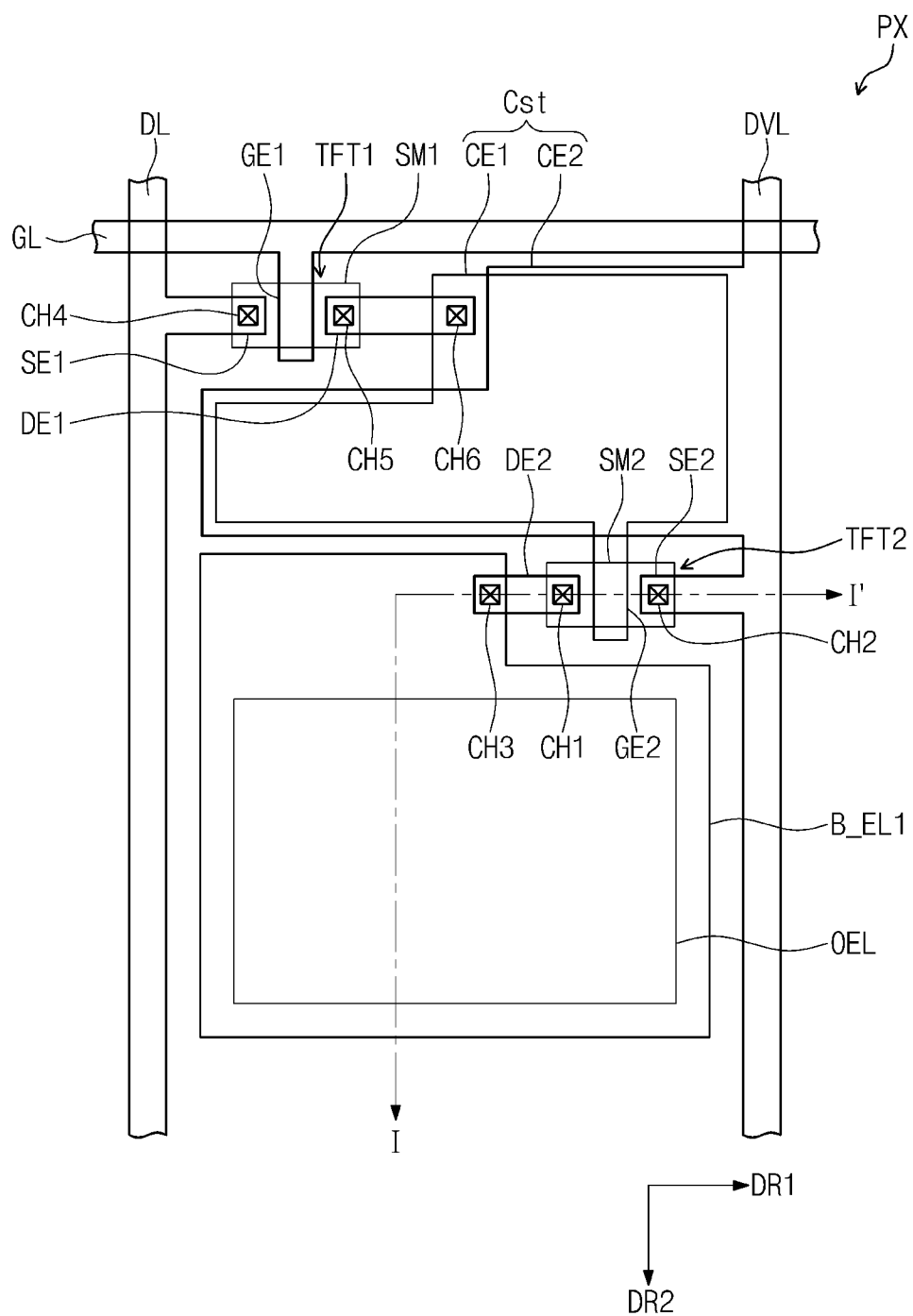
FIG. 3 is a plan view of one of the pixels provided in the display device according to an embodiment of the inventive concept.

FIG. 3 is a plan view of one of the pixels provided in the display device according to an embodiment of the inventive concept.

Figure 4:
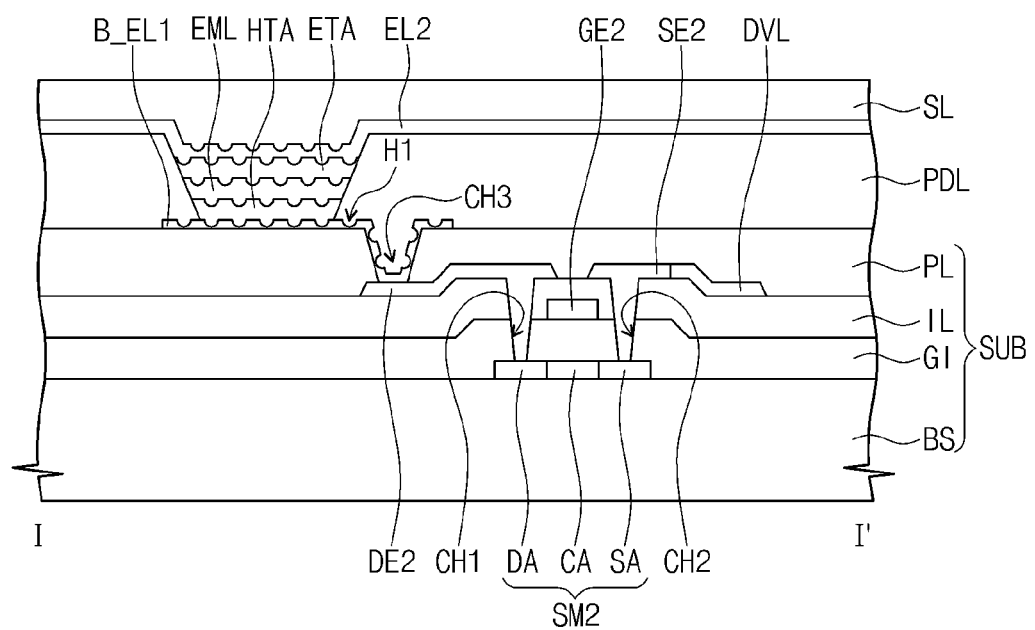
FIG. 4 is a schematic cross-sectional view taken along line I-I' of FIG. 3.

FIG. 4 is a schematic cross-sectional view taken along line I-I' of FIG. 3.

Referring to FIGS. 2 through 4, each of the pixels PX includes a wiring unit constituted by a gate line GL, a data line DL, and a driving voltage line DVL and thin film transistors TFT1 and TFT2 connected to the wiring unit, an organic emitting light element OEL connected to the thin film transistors TFT1 and TFT2, and a capacitor Cst.

Each of the pixels PX may emit light having a specific color, for example, one of red light, green light, and blue light. A kind of color light is not limited to the above-described light. For example, the color light may further include cyan light, magenta light, and yellow light.

The gate line GL extends in a first direction (e.g., a DR1 direction of FIG. 1). The data line DL extends in a second direction (e.g., a DR2 direction of FIG. 1) that crosses the gate line GL. The driving voltage line DVL extends in the substantially same direction as the data line DL, for example in a second direction (the DR2 direction of FIG. 1). The gate line GL transmits a scanning signal into the thin film transistors TFT1, the data line DL transmits a data signal into the thin film transistors TFT2, and the driving voltage line DVL provides a driving voltage into the thin film transistors TFT2.

The thin film transistors TFT1 and TFT2 may include a driving thin film transistor TFT2 for controlling the organic light emitting element OEL and a switching thin film transistor TFT1 for switching the driving thin film transistor TFT2. Each of the pixels PX includes the two thin film transistors TFT1 and TFT2 in an embodiment of the inventive concept, but is not limited thereto. For example, each of the pixels PX may include at least three thin film transistors and at least two capacitors.

Referring to FIG. 3, the switching thin film transistor TFT1 includes a first gate electrode GE1, a first source electrode SE1, and a first drain electrode DE1. The first gate electrode GE1 is connected to the gate line GL, and the first source electrode SE1 is connected to the data line DL. The first drain electrode DE1 is connected to a first common electrode CE1 by a sixth contact hole CH6. The switching thin film transistor TFT1 transmits the data signal applied into the data line DL into the driving thin film transistor TFT2 according to the scanning signal applied into the gate line GL.

The driving thin film transistor TFT2 includes a second gate electrode GE2, a second source electrode SE2, and a second drain electrode DE2. The second gate electrode GE2 is connected to the first common electrode CE1. The second source electrode SE2 is connected to the driving voltage line DVL. The second drain electrode DE2 is connected to an uneven first electrode B_EL1 by a third contact hole CH3.

Referring to FIG. 3 and FIG. 4, the organic light emitting element OEL is disposed between the uneven first electrode B_EL1 and a second electrode EL2. The uneven first electrode B_EL1 is connected to the second drain electrode DE2 of the driving thin film transistor TFT2. When a common voltage is applied to the second electrode EL2, a light emitting layer EML emits light (e.g. blue light) according to an output signal of the driving thin film transistor TFT2 to display an image. The organic light emitting element OEL, the uneven first electrode B_EL1, and the second electrode EL2 will be described below in more detail.

Referring to FIG. 2, the capacitor Cst is connected between the gate electrode (GE2 in FIG. 3) and the source electrode (SE2 in FIG. 3) of the driving thin film transistor TFT2 to charge and maintain the data signal inputted into the gate electrode of the driving thin film transistor TFT2. Also, referring to FIG. 2, the capacitor Cst may include the first common electrode CE1 connected to the drain electrode (DE1 in FIG. 3) of the switching transistor TFT1 by a sixth contact hole CH6 and a second common electrode CE2 connected to the driving voltage line DVL.

Referring to FIGS. 3 and 4, the display device 10 according to an embodiment of the inventive concept include a base substrate BS on which the thin film transistor and the organic light emitting element OEL are stacked. The base substrate BS is not particularly limited to a material thereof if the material for forming the base substrate BS is usually used. For example, the base substrate BS may be formed of an insulating material such as glass, plastic, crystal. An organic polymer for forming the base substrate BS may include polyethylene terephthalate (PET), polyethylene naphthalate (PEN), polyimide, and polyether sulfone. The base substrate BS may be adequately selected based on mechanical strength, thermal stability, transparency, surface roughness, tractability, waterproofing property, and the like.

A substrate buffer layer (not shown) may be disposed on the base substrate BS. The substrate buffer layer (not shown) may prevent impurities from being diffused into the switching thin film transistor TFT1 and the driving thin film transistor TFT2. The substrate buffer layer (not shown) may be formed of $SiN_x$, $SiO_x$, or $SiO_xN_y$. Also, the substrate buffer layer may be omitted depending on the material and process conditions of the base substrate BS.

A first semiconductor layer SM1 and a second semiconductor layer SM2 are disposed on the base substrate BS. The first semiconductor layer SM1 and the second semiconductor layer SM2 are formed of a semiconductor material. Also, the first and second semiconductor layers SM1 and SM2 may function as active layers of the switching and driving thin film transistors TFT1 and TFT2, respectively. Each of the first and second semiconductor layers SM1 and SM2 includes a source area SA, a drain area DA, and a channel area CA disposed between the source area SA and the drain area DA. Each of the first and second semiconductor layers SM1 and SM2 may be formed of a material selected from inorganic semiconductor and organic semiconductor. The source area SA and the drain area DA may be doped within n-type impurities or p-type impurities.

A gate insulation layer GI is disposed on the first and second semiconductor layers SM1 and SM2. The gate insulation layer GI covers the first and second semiconductor layers SM1 and SM2. The gate insulation layer GI may be formed of an organic insulation material or inorganic insulation material.

First and second gate electrode GE1 and GE2 are disposed on the gate insulation layer GI. Each of the first and second gate electrodes GE1 and GE2 covers an area corresponding to the channel area CA of each of the first and second semiconductor layers SM1 and SM2.

An interlayer dielectric IL is disposed on the first and second gate electrodes GE1 and GE2. The interlayer dielectric IL covers the first and second gate electrodes GE1 and GE2. The interlayer dielectric IL may be formed of organic insulating material or inorganic insulating material.

The first source and drain electrodes SE1 and DE1 and the second source and drain electrodes SE2 and DE2 are disposed on the interlayer dielectric IL. The second drain electrode DE2 contacts the drain area DA of the second semiconductor layer SM2 by a first contact hole CH1 defined in the gate insulation layer GI and the interlayer dielectric IL, and the second source electrode SE2 contacts the source area SA of the second semiconductor layer SM2 by a second contact hole CH2 defined in the gate insulation layer GI and the interlayer dielectric IL. Likewise, the first source electrode SE1 contacts a source area (not shown) of the first semiconductor layer SM1 by a fourth contact hole CH4 defined in the gate insulation layer GI and the interlayer dielectric IL, and the first drain electrode DE1 contacts a drain area (not shown) of the first semiconductor layer SM1 by a fifth contact hole CH5 defined in the gate insulation layer GI and the interlayer dielectric IL.

The uneven first electrode B_EL1 is disposed on the passivation layer PL. For example, the uneven first electrode B_EL1 may be an anode electrode working as a pixel electrode. The uneven first electrode B_EL1 is connected to the driving thin film transistor TFT2. The uneven first electrode B_EL1 is connected to the second drain electrode DE2 of the driving thin film transistor TFT2 through the third contact hole CH3 defined in the passivation layer PL.

The uneven first electrode B_EL1 may be a transmissive electrode, a transflective electrode, or a reflective electrode. When the uneven first electrode B_EL1 is the transmissive electrode, the uneven first electrode B_EL1 may be formed of metal oxide, for example, indium tin oxide (ITO), indium zinc oxide (IZO), zinc oxide (ZnO), or indium tin zinc oxide (ITZO). When the uneven first electrode B_EL1 is the transflective or reflective electrode, the uneven first electrode B_EL1 may be formed of Ag, Mg, Al, Pt, Pd, Au, Ni, Nd, Ir, Cr, or a metal mixture.

The uneven first electrode B_EL1 may have a single layer structure formed of transparent metal oxide or metal or a multi-layered structure including a plurality of layers. For example, the uneven first electrode B_EL1 may have a single layer structure of ITO, Ag, or metal mixture (for example, mixture of Ag and Mg), a two-layered structure of ITO/Mg or ITO/MgF, or a three-layered structure of ITO/Ag/ITO, but is not limited thereto.

The uneven first electrode B_EL1 includes electrode grooves H1. For example, the electrode grooves H1 are defined in a top surface of the uneven first electrode B_EL1 and are not defined in a bottom surface of the uneven first electrode B_EL1.

Figure 6A:
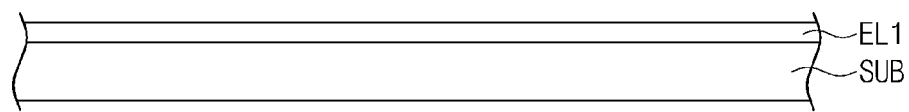
FIGS. 6A through 6F and 6H are cross-sectional views sequentially illustrating a method for fabricating the display device according to an embodiment of the inventive concept.
Figure 6B:
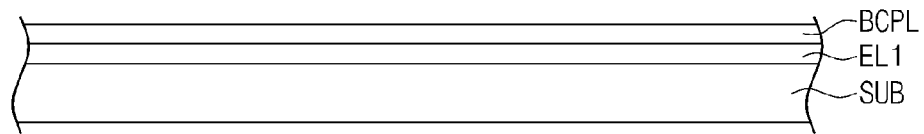
Figure 6C:
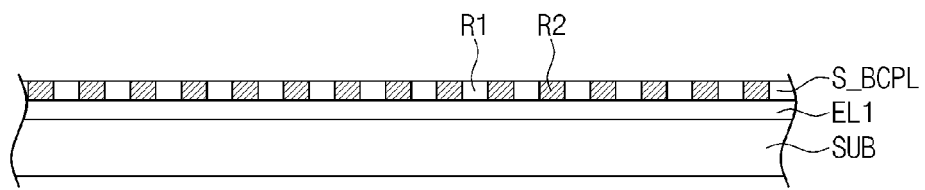

The uneven first electrode B_EL1 having the electrode grooves H1 may be formed by etching a first electrode (see reference symbol EL1 of FIG. 6A) by using a block copolymer pattern (see reference symbol BCP_P of FIG. 6D) as a mask. The block copolymer pattern (see reference symbol BCP_P of FIG. 6D) may be formed by etching a block copolymer layer (see reference symbol BCPL of FIG. 6B). This will be described below in more detail.

The electrode grooves H1 may be defined to be spaced apart at a predetermined interval from each other. For example, when viewed in the thickness direction (the DR3 direction of FIG. 1) of the display device 10, the electrode grooves H1 may be defined to be spaced apart from each other in the first direction DR1 and the second direction DR2 crossing the first direction DR1. Here, the electrode grooves H1 may be defined to be spaced at a first interval from each other. Also, the electrode grooves H1 may be defined to be spaced at a second interval from each other.

The electrode grooves H1 may have a uniform depth. For example, the electrode grooves H1 may have a uniform depth in the thickness direction (the DR3 direction of FIG. 1) of the display device 10.

If the electrode grooves are formed by using a general photolithography process, it may be difficult to form a fine structure having a size similar to that of a molecule. However, in the display device according to an embodiment of the inventive concept, the uneven first electrode having fine electrode grooves, each of which has a size similar to that of a molecule, may be formed by using the block copolymer. Therefore, the uneven first electrode having the electrode grooves that are spaced at a predetermined interval from each other may be formed through a relatively simple process.

A pixel defining layer PDL partitioning the pixel areas (see reference symbol PA of FIG. 1) to respectively correspond to the pixels PX is disposed on the passivation layer PL.

The pixel defining layer PDL exposes a top surface of the uneven first electrode B_EL1 and protrudes from the base substrate BS along a circumference of each of the pixels PX. The pixel defining layer PDL may overlap a portion of the uneven first electrode B_EL1.

The pixel defining layer PDL may include, but is not limited thereof, a metal-fluorine ion compound. For example, the pixel defining layer PDL may be formed of one metal-fluorine ion compound of LiF, $BaF_2$, and CsF. If the metal-fluorine ion compound has a predetermined thickness, the metal-fluorine ion compound may have an insulating property. For example, the pixel defining layer PDL may have a thickness of about 10 nm to about 100 nm.

The organic light emitting element OEL is disposed on the pixel area (see reference symbol PA of FIG. 1) that is surrounded by the pixel defining layer PDL.

The organic light emitting element OEL is disposed between the uneven first electrode B_EL1 and the second electrode EL2. The organic light emitting element OEL may include an organic layer. The organic layer may be disposed on the uneven first electrode B_EL1. The organic layer includes the light emitting layer EML. The organic layer may further include a hole transport area HTA and an electron transport area ETA.

The hole transport area HTA may be disposed on the uneven first electrode B_EL1 and the pixel defining layer PDL. The hole transport area HTA may include grooves and protrusions. For example, the grooves may be defined in a top surface of the hole transport area HTA. The protrusions to be coupled to the electrode grooves H1 may be disposed on a bottom surface of the hole transport area HTA.

The hole transport area HTA may include at least one of a hole injection layer, a hole transport layer, a buffer layer, and an electron stop layer, but is not limited thereto.

The hole transport area HTA may have a single layer structure formed of a single material, a single layer structure formed of materials different from each other, or a multi-layered structure including a plurality of layers formed of materials different from each other.

For example, the hole transport area HTA may have a single layer structure formed of a plurality of different materials or a structure of the hole injection layer/the hole transport layer, the hole injection layer/the hole transport layer/the buffer layer, the hole injection layer/the buffer layer, the hole transport layer/the buffer layer, or the hole injection layer/the hole transport layer/the electron stop layer, which are stacked in series from the uneven first electrode B_EL1, but is not limited thereto.

The hole transport area HTA may be formed by using various methods such as a vacuum deposition method, a spin coating method, a casting method, a Langmuir-Blodgett (LB) method, an inject printing method, a laser printing method, and a laser induced thermal imaging (LITI) method.

When the hole transport area HTA includes the hole injection layer, the hole transport area HTA may include a phthalocyanine compound such as copper phthalocyanine, N,N'-diphenyl-N,N'-bis-[4-(phenyl-m-tolyl-amino)-phenyl]-biphenyl-4,4'-diamine (DNTPD), 4,4',4"-tris(3-methylphenylphenylamino) triphenylamine (m-MTDATA), 4,4'4"-Tris(N,N-diphenylamino)triphenylamine (TDATA), 4,4',4"-tris{N,-(2-naphthyl)-N-phenylamino}-triphenylamine (2TNATA), poly(3,4-ethylenedioxythiophene)/poly(4-styrenesulfonate (PEDOT/PSS), polyaniline/dodecylbenzenesulfonic acid (PANI/DBSA), polyaniline/camphor sulfonicacid (PANI/CSA), and polyaniline/poly(4-styrenesulfonate) (PANI/PSS), but is not limited thereto.

When the hole transport area HTA includes the hole transport layer, the hole transport area HTA may include a carbazole-based derivative such as N-phenylcarbazole and polyvinylcarbazole, a fluorine-based derivative, a triphenylamine-based derivative such as N,N'-bis(3-methylphenyl)-N,N'-diphenyl-[1,1-biphenyl]-4,4'-diamine (TPD) and 4,4',4"-tris(N-carbazolyl)triphenylamine (TCTA), N,N'-di (1-naphthyl)-N,N'-diphenylbenzidine (NPB), and 4,4'-Cyclohexylidene bis[N,N-bis(4-methylphenyl)benzenamine] (TAPC), but is not limited thereto.

The hole transport area HTA may have a thickness of about 100 Å to about 10,000 Å, for example, about 100 Å to about 1,000 Å. When the hole transport area HTA includes all of the hole injection layer and the hole transport layer, the hole injection layer may have a thickness of about 100 Å to about 10,000 Å, for example, about 100 Å to about 1,000 Å, and the hole transport layer may have a thickness of about 50 Å to about 2,000 Å, for example, about 100 Å to about 1,500 Å. Each of the hole transport area HTA, the hole injection layer, and the hole transport layer with a thickness of the above-described range may show satisfactory hole transport characteristics without substantially increasing in driving voltage.

The hole transport area HTA may further include a charge generating material in addition to the above-described materials to improve conductivity. The charge generating material may be uniformly or non-uniformly dispersed into the hole transport area HTA. For example, the charge generating material may be p-dopant. The p-dopant may be one of a quinone derivative, a metal oxide derivative, a cyano-containing compound, but is not limited thereto. For example, according to a non-limiting example of the p-dopant, the p-dopant may include a quinine derivative such as tetracyanoquinodimethane (TCNQ) and 2,3,5,6-tetrafluoro-tetracyanoquinodimethane (F4-TCNQ) and metal oxide such as tungsten oxide and molybdenum oxide, but is not limited thereto.

As described above, the hole transport area HTA may further include at least one of the buffer layer and the electron stop layer in addition to the hole injection layer and the hole transport layer, but is not limited thereto. The buffer layer may compensate an optical resonance distance according to a wavelength of light coming from the light emitting layer EML to improve light emission efficiency. A material that can be contained in the hole transport area HTA may be used as a material to be contained in the buffer layer. The electron stop layer may be a layer that prevents electrons from being injected from the electron transport area ETA.

The light emitting layer EML may be disposed on the uneven first electrode B_EL1 and the pixel defining layer PDL. The light emitting layer EML may be disposed on the hole transport area HTA.

Also, the light emitting layer EML may include grooves and protrusions. For example, the grooves may be defined in a top surface of the light emitting layer EML. The protrusions to be coupled to the grooves of the hole transport area HTA may be disposed on a bottom surface of the light emitting layer EML.

The light emitting layer EML may contact the hole transport area HTA and the uneven pixel defining layer B_PDL. For example, the light emitting layer EML may contact the side surface defining layer groves H2 defined in the side surface of the uneven pixel defining layer B_PDL. The light emitting layer EML may include protrusions coupled to the side surface defining layer grooves H2. Although not shown, the light emitting layer EML may extend to contact top surface defining layer grooves H1 disposed on the top surface of the uneven pixel defining layer B_PDL.

The light emitting layer EML may have a single layer structure formed of a single material, a single layer structure formed of materials different from each other, or a multi-layered structure including a plurality of layers formed of materials different from each other.

The light emitting layer EML may be formed by using various methods such as a vacuum deposition method, a spin coating method, a casting method, a Langmuir-Blodgett (LB) method, an inject printing method, a laser printing method, and a laser induced thermal imaging (LITI) method.

The light emitting layer EML is not particularly limited to a material thereof if the material for forming the light emitting layer EML is usually used. For example, the light emitting layer EML may be formed of materials that emit red, green, and blue colors. Alternatively, the light emitting layer may include a phosphor material and a fluorescent material. Also, the light emitting layer EML may include host or dopant.

The host is not particularly limited to a material thereof if the material forming the host is usually used. For example, the host may be formed of tris(8-hydroxyquinolino)aluminum (Alq3), 4,4'-bis(N-carbazolyl)-1,1'-biphenyl (CBP), poly(n-vinylcabazole (PVK), 9,10-di(naphthalene-2-yl)anthracene (ADN), 4,4',4"-Tris(carbazol-9-yl)-triphenylamine (TCTA), 1,3,5-tris(N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), or 2-Methyl-9,10-bis(naphthalen-2-yl)anthracene (MADNP).

When the light emitting layer EML emits red light, the light emitting layer EML may include, for example, a phosphor material including tris(dibenzoylmethanato) phenanthoroline europium (PBD:Eu(DBM)3(Phen)) and perylene. When the light emitting layer EML emits the red light, the dopant contained in the light emitting layer EML may be selected from, for example, a metal complex or organometallic complex such as bis(1-phenylisoquinoline) acetylacetonate iridium (PIQIr(acac)), bis(1-phenylquinoline)acetylacetonate iridium (PQIr(acac)), PQIr(tris(1-phenylquinoline)iridium), octaethylporphyrin platinum (PtOEP).

When the light emitting layer EML emits green light, the light emitting layer EML may include, for example, a fluorescent material including Alq3(tris(8-hydroxyquinolino)aluminum. When the light emitting layer EML emits the green light, the dopant contained in the light emitting layer EML may be selected from, for example, a metal complex or organometallic complex such as Ir(ppy)3(fac-tris(2-phenylpyridine)iridium.

When the light emitting layer EML emits blue light, the light emitting layer EML may include, for example, a phosphor material including at least one selected from the group consisting spiro-DPVBi, spiro-6P, distyryl-benzene (DSB), distyryl-arylene (DSA), polyfluorene (PFO)-based polymer or poly(p-phenylene vinylene (PPV)-based polymer. When the light emitting layer EML emits the blue light, the dopant contained in the light emitting layer EML may be selected from, for example, a metal complex or organometallic complex such as (4,6-F2ppy)2Irpic.

As described above, the organic layer may further include the electron hole transport area ETA. The electron transport area ETA may be disposed on the uneven first electrode B_EL1 and the pixel defining layer PDL. The electron transport area ETA may be disposed on the light emitting layer EML.

The electron transport area ETA may include grooves and protrusions. For example, the grooves may be defined in a top surface of the electron transport area ETA. The protrusions to be coupled to the grooves of the light emitting layer EML may be disposed on a bottom surface of the electron transport area ETA.

The electron transport area ETA may include at least one of a hole stop layer, an electron transport layer, and an electron injection layer, but is not limited thereto.

For example, the electron transport area ETA may have a structure of the electron transport layer/the electron injection layer or the hole stop layer/the electron transport layer/the electron injection layer or a single layer structure in which at least two layers of the above-described layers are combined with each other, but is not limited thereto.

The electron transport area ETA may be formed by using various methods such as a vacuum deposition method, a spin coating method, a casting method, a Langmuir-Blodgett (LB) method, an inject printing method, a laser printing method, and a laser induced thermal imaging (LITI) method.

When the electron transport area ETA includes the electron transport layer, the electron transport area ETA may include Tris(8-hydroxyquinolinato)aluminum (Alq3), 1,3,-Tri(1-phenyl-1H-benzo[d]imidazol-2-yl)phenyl (TPBi), 2,9-Dimethyl-4,7-diphenyl-1,10-phenanthroline (BCP), 4,7-Diphenyl-1,10-phenanthroline (Bphen), 3-(4-Biphenylyl)-4-phenyl-5-tert-butylphenyl-1,2,4-triazole (TAZ), 4-(Naphthalen-1-yl)-3,5-diphenyl-4H-1,2,4-triazole (NTAZ), 2-(4-Biphenylyl)-5-(4-tert-butylphenyl)-1,3,4-oxadiazole (tBu-PBD), Bis(2-methyl-8-quinolinolato-N1,O8)-(1,1'-Biphenyl-4-olato)aluminum (BAlq), berylliumbis(benzoquinolin-10-olate (Bebq2), 9,10-di(naphthalene-2-yl)anthracene (ADN), and a mixture thereof, but is not limited thereto. The electron transport area ETA may have a thickness of about 100 Å to about 1,000 Å, for example, about 150 Å to about 500 Å. The electron transport layer with a thickness of the above-described range may achieve satisfactory electron transport characteristics without substantially increasing in driving voltage.

When the electron transport area ETA includes the electron injection layer, the electron transport area ETA may be formed of a material selected from lanthanum metals such as LiF, Lithium quinolate (LiQ), $Li_2O$, BaO, NaCl, CsF, and Yb or metal halides such as RbCl and RbI. The electron injection layer may be formed of a mixture of the material for the electron transport material and an organo metal salt.

The organo metal salt may be a material having an energy band gap of about 4 eV or more. For example, the organo metal salt may include metal acetate, metal benzoate, metal acetoacetate, metal acetylacetonate or metal stearate. The electron injection layer may have a thickness of about 1 Å to about 100 Å, for example, about 3 Å to about 90 Å. The electron injection layer with a thickness of the above-described range may achieve satisfactory electron injection characteristics without substantially increasing in driving voltage.

As described above, the electron transport area ETA may include the hole stop layer. For example, the hole stop layer may include at least one of 2,9-dimethyl-4,7-diphenyl-1,10-phenanthroline (BCP) and 4,7-diphenyl-1,10-phenanthroline (Bphen), but is not limited thereto. The hole stop layer may have a thickness of about 20 Å to about 1,000 Å, for example, about 30 Å to about 300 Å. The electron stop layer with a thickness of the above-described range may achieve satisfactory electron stop characteristics without substantially increasing in driving voltage.

The second electrode EL2 may be disposed on the uneven first electrode B_EL1 and the pixel defining layer PDL. The second electrode EL2 may be disposed on the electron transport area HTA.

The second electrode EL may include grooves and protrusions. For example, the grooves may be defined in a top surface of the second electrode EL2. The protrusions to be coupled to the grooves of the electron transport area ETA may be disposed on a bottom surface of the second electrode EL2.

The second electrode EL2 may be a cathode electrode working as a common electrode. The second electrode EL2 may be a transmissive electrode, a transflective electrode, or a reflective electrode.

When the second electrode EL2 is the transmissive electrode, the second electrode EL2 may include Li, Ca, LiF/Ca, LiF/Al, Al, Mg, Ag or a compound or mixture (e.g., a mixture of Ag and Mg) thereof. The second electrode EL may include an auxiliary electrode. The auxiliary electrode may include a layer formed by depositing the above-described material toward the light emitting layer and transparent metal oxide on the layer, for example, indium tin oxide (ITO), indium zinc oxide (IZO), zinc oxide (ZnO), or indium tin zinc oxide (ITZO).

When the second electrode EL2 is the transflective electrode or the reflective electrode, the second electrode EL2 may include Ag, Mg, Al, Pt, Pd, Au, Ni, Nd, Ir, Cr, Li, Ca, LiF/Ca, LiF/Al, or a compound or mixture (e.g., a mixture of Ag and Mg) thereof. Alternatively, the second electrode EL2 may have a multi-layered structure including a reflective layer or transflective layer and a transparent conductive layer formed of indium tin oxide (ITO), indium zinc oxide (IZO), zinc oxide (ZnO), or indium tin zinc oxide (ITZO).

When the organic light emitting element OEL is a front light emitting type organic light emitting element, the first electrode EL1 may be the reflective electrode, and the second electrode EL2 may be the transmissive electrode or transflective electrode. When the organic light emitting element OEL is a rear light emitting type organic light emitting element, the first electrode EL1 may be the transmissive electrode or transflective electrode, and the second electrode EL2 may be the reflective electrode.

An encapsulation layer SL for covering the second electrode EL2 may be disposed on the second electrode EL2. The encapsulation layer SL may include an organic material or inorganic material. The encapsulation layer SL protects the organic light emitting element OEL.

In general, the display device may include the organic light emitting element that does not have grooves, the flat shape first electrode, and the flat shape second electrode. Thus, the general display device may have high light emission efficiency with respect to horizontally polarized light, but may have low light emission efficiency with respect to vertically polarized light. The display device according to an embodiment of the inventive concept may include the organic light emitting element having the grooves that are spaced at a predetermined interval from each other, the uneven first electrode, and the second electrode. Thus, each of the organic light emitting element, the uneven first electrode, and the second electrode may have spatial anisotropy to improve the emission efficiency of the vertically polarized light.

Further, the display device according to an embodiment of the inventive concept may form the fine electrode grooves, each of which has a size similar to that of molecule, by using the block copolymer and the electrode grooves may be defined to be spaced at a predetermined interval from each other through a simple process. Thus, the display device according to an embodiment of the inventive concept may improve the emission efficiency of the vertically polarized light. This improves user's visibility with respect to an image displayed on the display device and in turn display quality of the device.

Hereinafter, a method for fabricating the display device according to an embodiment of the inventive concept will be described. Hereinafter, different points with respect to the display device according to the foregoing embodiment of the inventive concept will be mainly described. It should be understood in combination with the foregoing embodiment of the inventive concept.

FIG. 5 is a schematic flowchart illustrating a method for fabricating the display device according to an embodiment of the inventive concept.

Referring to FIGS. 1 through 5, a method for fabricating the display device 10 according to an embodiment of the inventive concept include a process (S100) of forming thin film transistors TFT1 and TFT2 on a base substrate BS, a process (S200) of forming a first electrode EL1 connected to the thin film transistors TFT1 and TFT2, a process (S300) of a block copolymer layer BCPL on the first electrode EL1, a process (S400) of patterning the block copolymer layer BCPL and etching the first electrode EL1 by using the patterned block copolymer layer BCPL as a mask to form a uneven first electrode B_EL1 including a plurality of electrode grooves H1, and a process (S500) forming a light emitting layer EML on the uneven first electrode B_EL1.

FIGS. 6A through 6F and 6H are cross-sectional views sequentially illustrating a method for fabricating the display device according to an embodiment of the inventive concept.

Figure 6D:
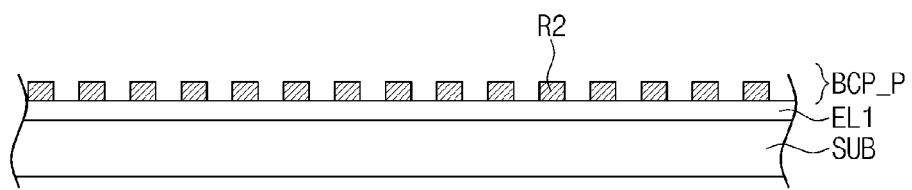
Figure 6E:
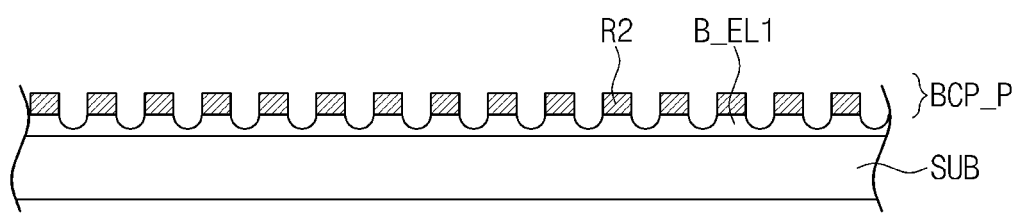
Figure 6F:
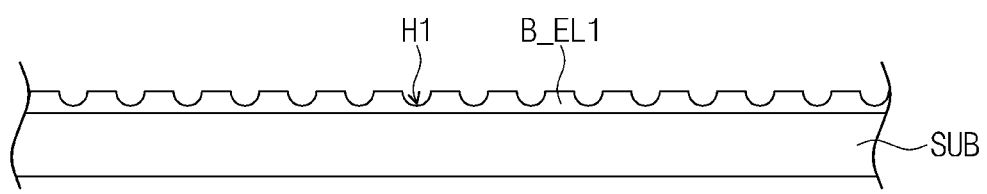
Figure 6H:
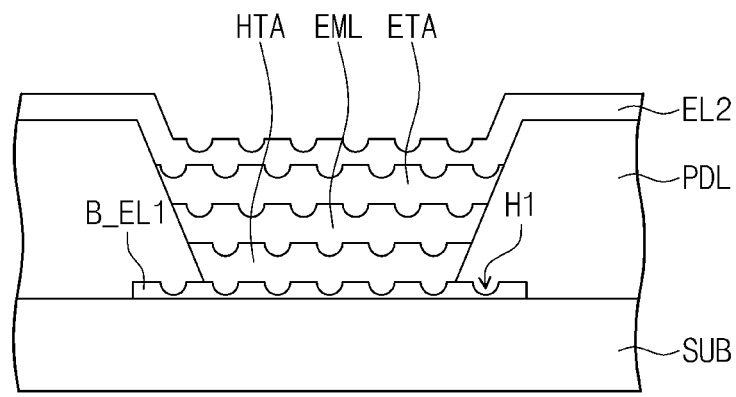

FIG. 6G is a schematic perspective view of the display device of FIG. 6F.

Referring to FIGS. 1 through 5 and 6A, a base substrate BS is prepared. In operation S100, thin film transistors TFT1 and TFT2 are formed on the base substrate BS. In operation S200, a first electrode EL1 is formed on the base substrate BS and a substrate including the thin film transistors TFT1 and TFT2.

Referring to FIGS. 1 through 5 and 6B, in operation S300, a block copolymer layer BCPL is formed on the first electrode EL1.

In the process (S300) of forming the block copolymer layer BCPL, the block copolymer layer BCPL is not particularly limited to a material thereof if the material for forming the block copolymer layer BCPL is usually used. For example, the block copolymer layer BCPL may be formed of at least one block copolymer of a polystyrene-polymethylmethacrylate copolymer, a polybutadiene-polybutylmethacrylate copolymer, a polybutadiene-polydimethylsiloxane copolymer, a polybutadienepolymethylmethacrylate copolymer, a polybutadiene-polyvinylpyridine copolymer, a polybutylacrylate-polymethylmethacrylate copolymer, polybutylacrylate-polyvinylpyridine copolymer, a polyisoprene-polyvinylpyridine copolymer, a polyisoprenepolymethylmethacrylate copolymer, a polyhexylacrylate-polyvinylpyridine copolymer, a polyisobutylene-polybutylmethacrylate copolymer, a polyisobutylene-polymethylmethacrylate copolymer, a polyisobutylene-polybutylmethacrylate copolymer, a polyisobutylenepolydimethylsiloxane copolymer, a polybutylmethacrylatepolybutylacrylate copolymer, a polyethylethylene-polymethylmethacrylate copolymer, a polystyrene-polybutylmethacrylate copolymer, a polystyrene-polybutadiene copolymer, a polystyrene-polyisoprene copolymer, a polystyrene-polydimethylsiloxane copolymer, a polystyrene-polyvinylpyridine copolymer, a polyethylethylene-polyvinylpyridine copolymer, a polyethylene-polyvinylpyridine copolymer, a polyvinylpyridinepolymethylmethacrylate copolymer, a polyethyleneoxide-polyisoprene copolymer, a polyethyleneoxide-polybutadiene copolymer, a polyethyleneoxide-polystyrene copolymer, a polyethyleneoxidepolymethylmethacrylate copolymer, a (polyethyleneoxide-polydimethylsiloxane copolymer, and a polystyrene-polyethyleneoxide copolymer.

The block copolymer may include a linear or branched polymer having a molecular weight of several thousand g/mol to several million g/mol, for example, about 3,000 g/mol to about 2,000,000 g/mol.

The block copolymer is not particularly limited to a shape thereof if the shape of the block copolymer is usually used. For example, the block copolymer may include a diblock copolymer in which a first repeating unit (see reference symbol R1 of FIG. 6C) and a second repeating unit (see reference symbol R2 of FIG. 6C) are covalently bonded in the form of (first repeating unit)-co-(second repeating unit) or a triblock copolymer in which the first repeating unit and the second repeating unit are covalently bonded in the form of (first repeating unit)-co-(second repeating unit)-co-(first repeating unit). Alternatively, the block copolymer may include a triblock copolymer in which the first repeating unit, the second repeating unit, and a third repeating unit are covalently bonded in the form of (first repeating unit)-co-(second repeating unit)-co-(third repeating unit). However, the present disclosure is not limited thereto. For example, the block copolymer may include a multi-component block copolymer having various forms within the idea and scope of the inventive concept.

Referring to FIGS. 1 through 5, in operation S400, the block copolymer layer (see reference symbol BCPL of FIG. 6B) is patterned, and then the first electrode (see reference symbol EL1 of FIG. 6B) is etched by using the pattern block copolymer as a mask to form a uneven first electrode B_EL1 having electrode grooves H1. In the process (S400) of forming the uneven first electrode B_EL1 may include a process of patterning the block copolymer (see reference symbol BCPL of FIG. 6B) to form a block copolymer pattern (see reference symbol BCP_P of FIG. 6D) and a process of etching the first electrode (see reference numeral EL1 of FIG. 6B) by using the block copolymer pattern (see reference symbol BCP_P of FIG. 6D) as a mask to form the uneven first electrode B_EL1 having the electrode grooves H1.

The forming of the block copolymer pattern BCP_P may include a process of rearranging the first repeating units (see reference symbol R1 of FIG. 6C) and the second repeating units (see reference symbol R2 of FIG. 6C) to form a self-assembly structure (see reference symbol S_BPCL of FIG. 6C) in which the first repeating units (see reference symbol R1 of FIG. 6C) and the second repeating units (see reference symbol R2 of FIG. 6C) are alternately arranged and a process of removing the first repeating units (see reference symbol R1 of FIG. 6C) to form the block copolymer pattern (see reference numeral BCP_P of FIG. 6D).

Referring to FIGS. 1 through 5 and 6C, the first repeating units R1 and the second repeating units R2 may be rearranged to form the self-assembly structure S_BPCL in which the first repeating units and the second repeating units R2 are alternately arranged.

In the forming of the self-assembly structure S_BPCL, the block copolymer may be self-assembled with various structures. For example, the block copolymer may be self-assembled with a sphere, cylinder, lamellar, gyroid, or HPL (hexagonal perforated cylinder) structure.

The forming of the self-assembly structure S_BCPL is not particularly limited if the process of forming the self-assembly structure S_BCPL is usually performed. For example, the self-assembly structure S_BCPL may be formed through thermal processing or solvent annealing.

Referring to FIGS. 1 through 5, 6C, and 6D, the first repeating units R1 are removed to form the block copolymer pattern BCP_P.

For example, the block copolymer pattern BCP_P may not be etched to form the second repeating units R2 remaining on the substrate SUB and the first electrode EL1. The block copolymer pattern BCP_P may be spaced a predetermined interval from each other.

When forming the block copolymer pattern BCP_P, the first repeating units R1 may be etched to form the block copolymer pattern BCP_P. For example, the first repeating units R1 may be removed by dry etching.

When forming the block copolymer pattern BCP_P, how to etch the first repeating units R1 is not limited to a specific method. For example, the process of etching the first repeating units R1 may be performed by providing at least one of ozone, oxygen, plasma, and UV.

Referring to FIGS. 1 through 5 and 6E, the first electrode EL1 is etched by using the second repeating units R2 as a mask. The first electrode EL1 may be etched by using the second repeating units R2 as a mask to form the uneven first electrode B_EL1.

Referring to FIGS. 1 through 5, 6F, and 6G, a process of removing the second repeating units R2 remaining on the substrate SUB and the first electrode EL1 may be performed. Here, FIG. 6G is a schematic perspective view of the display device of FIG. 6F.

For example, the second repeating units R2 may be removed by dry etching. The process of etching the second repeating units R2 is not limited, as long as it is the normal process that is usually performed. For example, the first repeating units R2 may be etched by providing at least one of ozone, oxygen, plasma, and UV.

The uneven first electrode B_EL1 includes a plurality of electrode grooves H1. The electrode grooves H1 are defined on a top surface of the uneven first electrode B_EL1 and are not defined on a bottom surface of the uneven first electrode B_EL1.

The electrode grooves H1 may be defined to be spaced at a predetermined interval from each other. For example, when viewed in the thickness direction DR3 of the display device 10, the electrode grooves H1 may be defined to be spaced apart from each other in the first direction DR1 and the second direction DR2 crossing the first direction DR1. Here, the electrode grooves H1 may be defined to be spaced at a first interval P1 from each other. Also, the electrode grooves H1 may be defined to be spaced at a second interval P2 from each other. Here, each of the first interval P1 and the second interval P2 may be about 150 nm to about 350 nm.

In general, the display device may include the organic light emitting device that does not have grooves, the uneven first electrode, and the second electrode. Thus, the display device may have high light emission efficiency with respect to horizontally polarized light, but may have low light emission efficiency with respect to vertically polarized light. The display device fabricated by the method for fabricating the display device according to an embodiment of the inventive concept may include the organic light emitting device having the grooves that are spaced at a predetermined interval from each other, the uneven first electrode, and the second electrode. Thus, each of the organic light emitting device, the uneven first electrode, and the second electrode may have spatial anisotropy to improve the emission efficiency of the vertically polarized light. In the method for fabricating the display device according to an embodiment of the inventive concept, the fine electrode grooves, each of which has a size similar to that of molecule, may be formed by using the block copolymer. Also, the electrode grooves may be defined to be spaced at a predetermined interval from each other through a simple process. Thus, the display device fabricated by the method for fabricating the display device according to an embodiment of the inventive concept may improve the emission efficiency of the vertically polarized light. Accordingly, user's visibility with respect to an image displayed on the display device may be improved to improve display quality of the display device.

When the light emitting layer EML emits red light, each of the first interval P1 and the second interval P2 may be about 250 nm to about 350 nm. When the first and second intervals P1 and P2 satisfy the above-described range, emission efficiency of vertically polarized red light may improve. When the first and second intervals P1 and P2 get out of the above-described range, the vertical polarized light may be obtained. However, the light does not belong to a wavelength range of the red light, and thus it is difficult to improve the emission efficiency of the red light.

When the light emitting layer EML emits green light, each of the first interval P1 and the second interval P2 may be about 200 nm to about 300 nm. When the first and second intervals P1 and P2 satisfy the above-described range, emission efficiency of vertically polarized green light may improve. When the first and second intervals P1 and P2 get out of the above-described range, the vertical polarized light may be obtained. However, the light does not belong to a wavelength range of the green light, and thus it is difficult to improve the emission efficiency of the green light.

When the light emitting layer EML emits blue light, each of the first interval P1 and the second interval P2 may be about 150 nm to about 200 nm. When the first and second intervals P1 and P2 satisfy the above-described range, emission efficiency of vertically polarized blue light may improve. When the first and second intervals P1 and P2 get out of the above-described range, the vertical polarized light may be obtained. However, the light does not belong to a wavelength range of the blue light, and thus it is difficult to improve the emission efficiency of the blue light.

Although the first and second intervals P1 and P2 are the same in FIG. 6G, the present disclosure is not limited thereto. For example, the first and second intervals P1 and P2 may be different from each other.

The electrode grooves H1 may have a uniform depth. For example, the electrode grooves H1 may have a uniform depth in the thickness direction DR3 of the display device 10. The electrode grooves H1 may have a depth, for example, about 5 nm to about 1,000 nm. When each of the electrode grooves H1 has a depth less than about 5 nm, it may be difficult to control the process due to the short distance between the defining layer grooves. On the other hand, when each of the electrode grooves H1 has a depth greater than about 1,000 nm, it may be difficult to be applied to products due to the high thickness of the uneven first electrode B_EL1.

Referring to FIGS. 1 through 5 and 6H, in operation S500, the light emitting EML is formed on the uneven first electrode B_EL1 and the pixel defining layer PDL.

The light emitting layer EML may be disposed on the uneven first electrode B_EL1 and the pixel defining layer PDL. The light emitting layer EML may be disposed on the hole transport area HTA.

Also, the light emitting layer EML may include grooves and protrusions. For example, the grooves may be defined in a top surface of the light emitting layer EML. The protrusions to be coupled to the grooves of the hole transport area HTA may be disposed on a bottom surface of the light emitting layer EML.

In the method for fabricating the display device 10 according to an embodiment of the inventive concept may further include a process of forming a second electrode EL2 on the light emitting layer EML.

The second electrode EL2 may be disposed on the uneven first electrode B_EL1 and the pixel defining layer PDL. The second electrode EL2 may be disposed on the electron transport area HTA.

The second electrode EL may include grooves and protrusions. For example, the grooves may be defined in a top surface of the second electrode EL2. The protrusions to be coupled to the grooves of the electron transport area ETA may be disposed on a bottom surface of the second electrode EL2.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A display device, comprising:
   a base substrate; and
   a plurality of pixels,
   wherein at least one of the pixels comprises:
      a thin film transistor disposed on the base substrate;
      an uneven first electrode connected to the thin film transistor, the uneven first electrode having a plurality of electrode grooves;
      a light emitting layer disposed on the uneven first electrode; and
      a second electrode disposed on the light emitting layer,
      wherein each of the light emitting layer and the second electrode comprises a plurality of grooves.

2. The display device of claim 1, wherein the plurality of electrode grooves are defined to be spaced at a first interval from each other in the first direction, and defined to be spaced at a second interval from each other in the second direction crossing the first direction.

3. The display device of claim 2, wherein each of the first interval and the second interval is from about 150 nm to about 350 nm.

4. The display device of claim 1, wherein the plurality of electrode grooves have depths that are substantially uniform.

5. The display device of claim 4, wherein the electrode groove is about 5 nm to about 1,000 nm deep.

6. The display device of claim 1, wherein the plurality of electrode grooves are defined in a top surface of the uneven first electrode.

7. The display device of claim 1, wherein the light emitting layer comprises a plurality of protrusions disposed on a bottom surface of the light emitting layer, and the second electrode comprises a plurality of protrusions disposed on a bottom surface of the second electrode.

* * * * *